US009266330B2

(12) United States Patent
Fujii et al.

(10) Patent No.: US 9,266,330 B2
(45) Date of Patent: Feb. 23, 2016

(54) PROCESS FOR PRODUCING A SEMICONDUCTOR CHIP

(71) Applicant: CANON KABUSHIKI KAISHA, Tokyo (JP)

(72) Inventors: Kenji Fujii, Yokohama (JP); Mitsuru Chida, Yokohama (JP); Makoto Watanabe, Yokohama (JP); Toshiaki Kurosu, Oita (JP); Masataka Nagai, Yokohama (JP); Takanobu Manabe, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/152,272

(22) Filed: Jan. 10, 2014

(65) Prior Publication Data

US 2014/0212998 A1 Jul. 31, 2014

(30) Foreign Application Priority Data

Jan. 25, 2013 (JP) ................................ 2013-011822

(51) Int. Cl.
*H01L 21/44* (2006.01)
*B41J 2/16* (2006.01)

(52) U.S. Cl.
CPC .............. *B41J 2/1603* (2013.01); *B41J 2/1626* (2013.01); *B41J 2/1631* (2013.01); *B41J 2/1643* (2013.01); *B41J 2/1645* (2013.01)

(58) Field of Classification Search
CPC ............................................ H01L 2924/01079
USPC .................. 438/689, 690, 678; 257/E23.069
See application file for complete search history.

(56) References Cited

U.S. PATENT DOCUMENTS

| | | | | |
|---|---|---|---|---|
| 6,390,606 | B1 | 5/2002 | Terui et al. | |
| 6,830,317 | B2 | 12/2004 | Tsuchii et al. | |
| 7,494,913 | B2 * | 2/2009 | Jomaa et al. | 438/613 |
| 2010/0013094 | A1 * | 1/2010 | Jo et al. | 257/738 |
| 2012/0009783 | A1 * | 1/2012 | Lin | 438/666 |
| 2012/0129333 | A1 * | 5/2012 | Yim et al. | 438/613 |

FOREIGN PATENT DOCUMENTS

| | | | |
|---|---|---|---|
| JP | 11-348290 | A | 12/1999 |
| JP | 2003-311964 | A | 11/2003 |
| JP | 2009-274266 | A | 11/2009 |

OTHER PUBLICATIONS

Machine Translation of JP 2009-274266.*

* cited by examiner

*Primary Examiner* — Julia Slutsker
(74) *Attorney, Agent, or Firm* — Fitzpatrick, Cella, Harper & Scinto

(57) ABSTRACT

A process for producing a semiconductor chip having a substrate and a bump formed on the substrate including (1) forming, on a substrate, a conductor gold for plating to be a base of plating growth; (2) forming a mask for plating on the conductor gold for plating; (3) performing plating using the mask for plating to form the bump and a dummy pattern; (4) removing the mask for plating; (5) etching the conductor gold for plating; and (6) applying a shock to at least the dummy pattern. The amount of side etching of the conductor gold for plating is grasped from a state of separation of the dummy pattern due to the shock in the step (6).

4 Claims, 6 Drawing Sheets

PROCESS FOR PRODUCING A SEMICONDUCTOR CHIP

BACKGROUND OF THE INVENTION

1. Field of the Invention

The present invention relates to a process for producing a semiconductor chip including a bump.

2. Description of the Related Art

An electroplating process is disclosed in Japanese Patent Application Laid-Open No. 2009-274266. In the electroplating process, a photoresist is patterned. After growth of plating, a conductor gold for plating is etched and an adhesion improving layer of, for example, TiW is etched. Then, the photoresist is removed, thereby enabling completion of a pattern.

On the other hand, with regard to an ordinary liquid ejection head such as an ink jet recording head, in order to adapt to miniaturization and densification, a technology is proposed in which an electrical control circuit for driving an ejection-energy-generating element is incorporated into a substrate with use of a semiconductor production technology.

Further, in a highly functional ink jet recording head, by forming an ink supply port from a rear surface of the substrate through the substrate and arranging a large number of nozzles on the right and on the left of the opening in the substrate, miniaturization and higher image quality are realized. Such a structure is disclosed in, for example, Japanese Patent Application Laid-Open No. 2003-311964.

Further, with regard to the adhesion between a silicon substrate and a nozzle layer, a structure is proposed in which, as a nozzle adhesion improving layer, a polyether amide resin is sandwiched between the substrate and the nozzle layer. Such a structure is disclosed in, for example, Japanese Patent Application Laid-Open No. H11-348290.

SUMMARY OF THE INVENTION

According to one embodiment of the present invention, there is provided a process for producing a semiconductor chip including a substrate and a bump formed on the substrate, the process including:

(1) forming, on the substrate, a conductor gold for plating to be a base of plating growth;

(2) forming a mask for plating on the conductor gold for plating;

(3) performing plating using the mask for plating to form the bump and a dummy pattern;

(4) removing the mask for plating;

(5) etching the conductor gold for plating; and (6) applying a shock to at least the dummy pattern, in which an amount of side etching of the conductor gold for plating is grasped from a state of separation of the dummy pattern due to the shock in the step (6).

Further features of the present invention will become apparent from the following description of exemplary embodiments with reference to the attached drawings.

DESCRIPTION OF THE EMBODIMENTS

Figure 1:
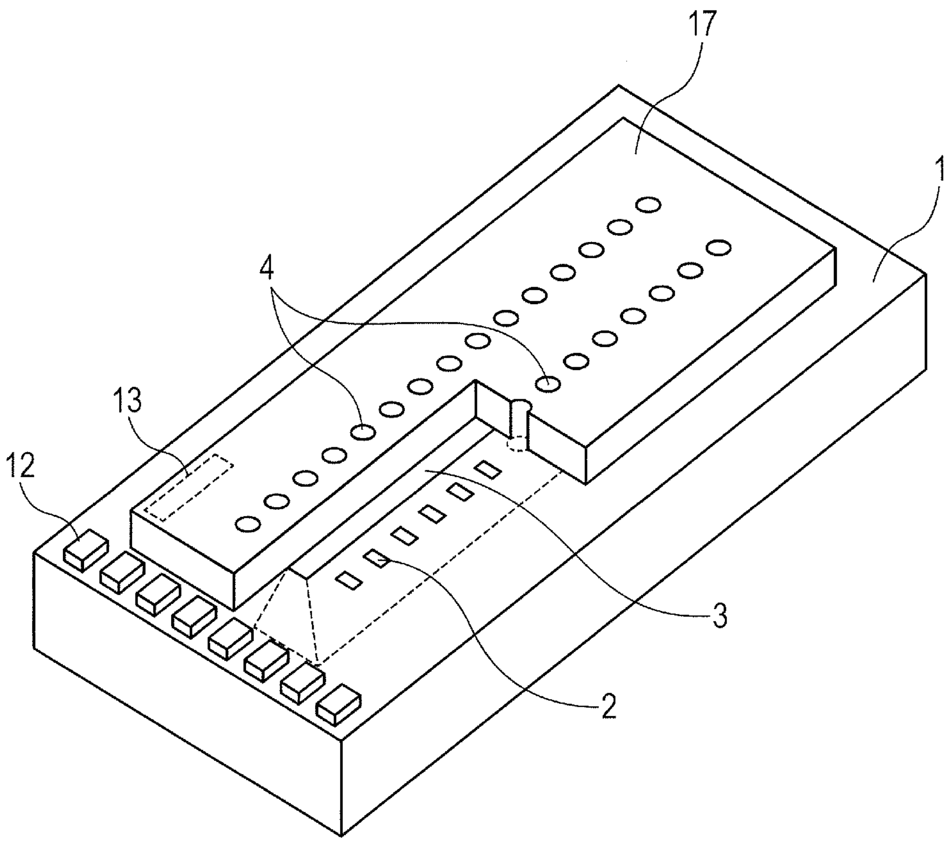
FIG. 1 is a schematic perspective view illustrating an exemplary structure of an ink jet recording head produced according to an embodiment of the present invention.

A plating pattern for securing electrical continuity which is produced by a production process described in Japanese Patent Application Laid-Open No. 2009-274266, that is, plating wiring or plating bumps, is ordinarily encapsulated for the purpose of enhancing the reliability of a contact portion, after being electrically connected to a component such as TAB. This encapsulation secures prevention of disconnection due to contact with another component and long-term electrical reliability as a product.

However, in the process of etching a plating base film, in order not to leave a residue, it is necessary to perform overetching. Further, degradation of an etchant reduces the etching rate in an adhesion improving layer (barrier metal) of TiW or the like, and thus, it is sometimes necessary to adjust the etching time so as to gradually increase during production. In the etching of the base film, the base film is so structured as to come below the wiring and the bump, and thus, the base film cannot be visually observed and relies on process assurance. However, in this step, if, due to some problem with regard to the apparatus, side etching is performed by more than a predetermined amount, a pattern loss may be caused. Further, penetration of the encapsulant may be insufficient to cause bubble entrainment. In the case of pattern loss or bubble entrainment, not only initial faulty electrical continuity is caused but also long-term electrical reliability cannot be secured of the semiconductor chip as a product.

In particular, with regard to an ink jet recording head, when the side etching is performed by more than a predetermined amount, penetration of the nozzle adhesion improving layer may be insufficient in the subsequent step, and a bubble may be entrained. After that, the bump portion is further encapsulated, but the bubble remains, and thus, long-term electrical reliability of the semiconductor chip as a product may not be secured.

In view of the situation described above, an object of the present invention is to provide a process for producing a semiconductor chip in which the amount of side etching of a plating base film can be easily grasped through visual observation.

A liquid ejection head according to the present invention can be mounted on a printer, a copying machine, a fax machine having a communication system, an apparatus such as a word processor including a printer portion, and further, an industrial recording apparatus combined with a processing apparatus of various kinds. By using the liquid ejection head, recording can be performed on various kinds of recording media such as paper, thread, fabric, leather, metal, plastic, glass, wood, and ceramic. Note that, "recording" as used herein means not only giving a meaningful image such as a letter or a shape but also giving a meaningless image such as a pattern to a recording medium. Further, "liquid" as used herein shall be broadly construed, and means a liquid which is, by being given onto a recording medium, used for formation of an image, a pattern, or the like, processing of a recording medium, or treatment of ink or a recording medium. The treatment of ink or a recording medium includes, for example, improvement in fixing property by solidification or insolubilization of a coloring material in ink given to a recording medium, improvement in recording quality or coloring ability, and improvement in image durability.

Figure 3:
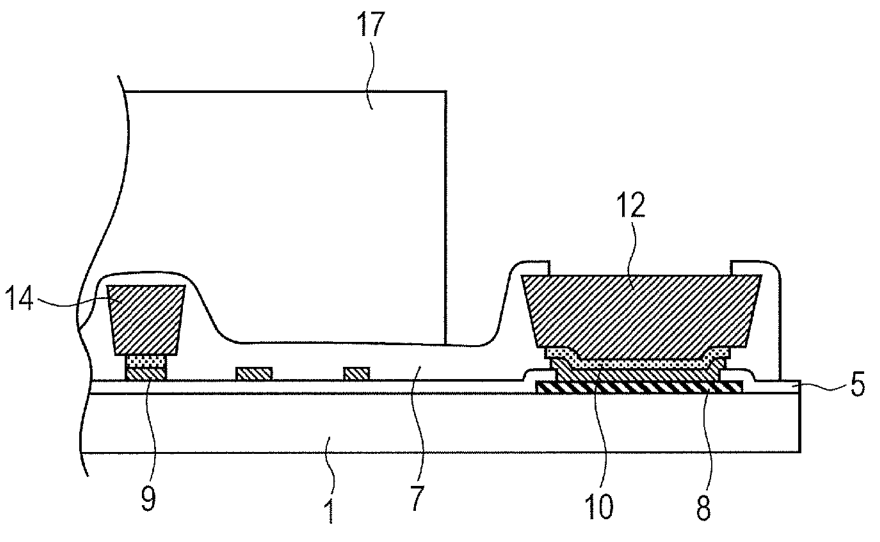
FIG. 3 is a schematic sectional view taken along the line 3-3 of FIG. 2.

An embodiment of the present invention is described in the following with reference to FIG. 3.

Note that, in the following description, an ink jet recording head is taken as an example of a liquid ejection head to which the present invention is applied, but the application range of the present invention is not limited thereto, and the present invention may also be applied to a process for producing a liquid ejection head for producing a biochip or for printing an electronic circuit in addition to an ink jet recording head. The present invention may also be applied to, for example, a process for producing a liquid ejection head for producing a color filter.

Next, the embodiment of the present invention is described with reference to the attached drawings.

FIG. 1 is a schematic perspective view illustrating an exemplary structure of an ink jet recording head as a semiconductor chip. The ink jet recording head includes a silicon substrate 1 in which ejection-energy-generating elements 2 such as electrothermal conversion elements are formed so as to be arrayed in two lines with predetermined pitches. An ink supply port 3 is formed in the silicon substrate 1 so as to be open between the two lines of the ejection-energy-generating elements 2. A flow path forming member (also referred to as nozzle layer) 17 which forms an ink flow path and ink ejection orifices 4 is provided on the silicon substrate 1. Further, the ink ejection orifices 4 open over the ejection-energy-generating elements 2, respectively, and the ink flow path is formed from the ink supply port 3 so as to communicate with the ink ejection orifices 4.

A dummy pattern formation region (hereinafter also referred to as detection pattern formation region) 13 is a region in which a dummy pattern (hereinafter also referred to as detection pattern) is formed to be used for grasping the amount of side etching in this embodiment. Details of the dummy pattern are described later.

Further, bumps (terminals) 12 are formed on an external electrical connection portion for supplying electric power to the ejection-energy-generating elements 2. The ink jet recording head is placed so that a surface thereof having the ink ejection orifices 4 formed therein faces a recording surface of a recording medium. By applying pressure generated by the ejection-energy-generating elements 2 to ink which is filled into the ink flow path via the ink supply port 3, ink droplets are ejected from the ink ejection orifices 4. Recording is performed by attachment of the ejected ink droplets onto the recording medium.

Embodiment 1

Figure 2:
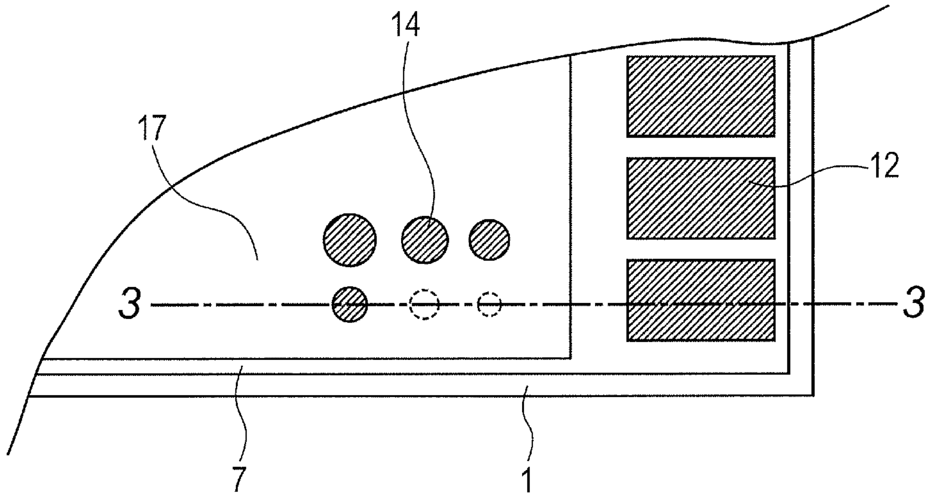
FIG. 2 is an enlarged schematic top view illustrating an exemplary structure of a dummy pattern of the embodiment of the present invention.

FIG. 2 is an enlarged view illustrating the vicinity of the dummy pattern formation region (detection pattern formation region) 13 according to this embodiment. As illustrated in FIG. 2, a dummy pattern (detection pattern) 14 and the bumps 12 which function as the external electrical connection portion are formed on the same plane.

Next, a structure on the silicon substrate 1 is described with reference to FIG. 3. FIG. 3 is a sectional view taken along the line 3-3 of FIG. 2. First, the silicon substrate 1 is prepared in which ejection-energy-generating elements (not shown) for generating ink ejection energy such as electrothermal conversion elements are formed and on which a wiring layer 8 and a protective film 5 are formed. On the silicon substrate 1, for the purpose of forming the external electrical connection portion, part of the protective film 5 is removed to expose part of the wiring layer 8. A bump 12 is formed using plating on a portion where the wiring layer 8 is exposed. According to this embodiment, the plating is used to form the detection pattern 14 with the same material as that of the bump 12 in the same step, and thus, the detection pattern 14 has the same thickness as that of the bump 12.

Next, a production process according to this embodiment is described with reference to FIGS. 4A to 4G.

Figure 4A:
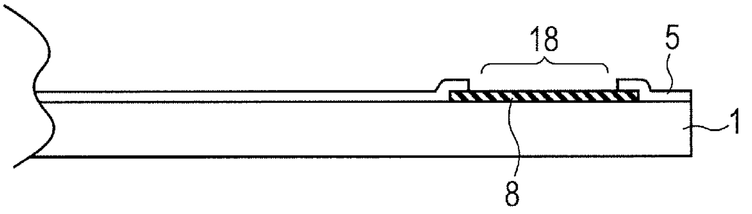
FIGS. 4A, 4B, 4C, 4D, 4E, 4F and 4G are schematic sectional views of steps for illustrating a producing process according to the embodiment of the present invention.

First, as illustrated in FIG. 4A, a substrate (for example, silicon substrate) 1 is prepared in which ejection-energy-generating elements (not shown) such as electrothermal conversion elements are formed and on which a wiring layer 8 and a protective film 5 are formed in a semiconductor facility. A through hole 18 is formed on the wiring layer 8 for electrical contact with the external, and part of the wiring layer 8 is exposed.

Figure 4B:
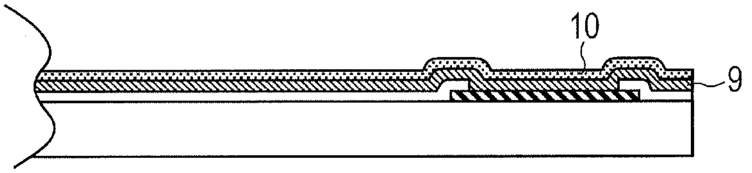

Then, as illustrated in FIG. 4B, an adhesion improving layer (also referred to as first layer) 9 for improving the adhesion between the substrate 1 and a conductor gold 10 for plating (seed) to be a base of plating growth is formed on the substrate 1. Further, the conductor gold 10 for plating is formed on the adhesion improving layer 9.

Specifically, the adhesion improving layer (barrier metal) 9 of a high-melting-point metal material such as TiW is formed over the entire surface of the substrate by using a vacuum film deposition apparatus or the like at a film thickness of about 200 nm. It is preferred that the film thickness be in a range of 50 nm to 1,000 nm, because, in that range, the role as an adhesion improving layer can be played more effectively. Then, the conductor gold 10 for plating which is also excellent as a metal for wiring is formed on the adhesion improving layer over the entire surface of the substrate by using a vacuum film deposition apparatus or the like at a film thickness of about 50 nm. The film thickness of the conductor gold 10 for plating is, for example, in a range of 20 nm to 500 nm.

Figure 4C:
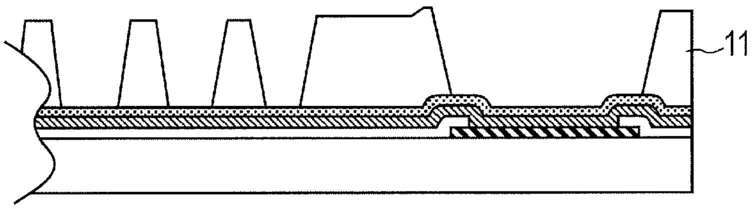

Then, as illustrated in FIG. 4C, a mask 11 for plating is formed on the conductor gold 10 for plating. The mask 11 for plating has an opening pattern corresponding to at least the bump 12 and the detection pattern 14.

Specifically, a photoresist is applied onto the conductor gold 10 for plating by spin coating, and the photoresist is patterned to form the mask 11 for plating. At this time, the photoresist is applied so that the film thickness thereof is larger than that of plating (bump 12 and detection pattern 14) to be formed in the subsequent step, and the photoresist is exposed and developed by photolithography to be patterned. The film thickness of the photoresist is, for example, 6 μm.

Figure 5:
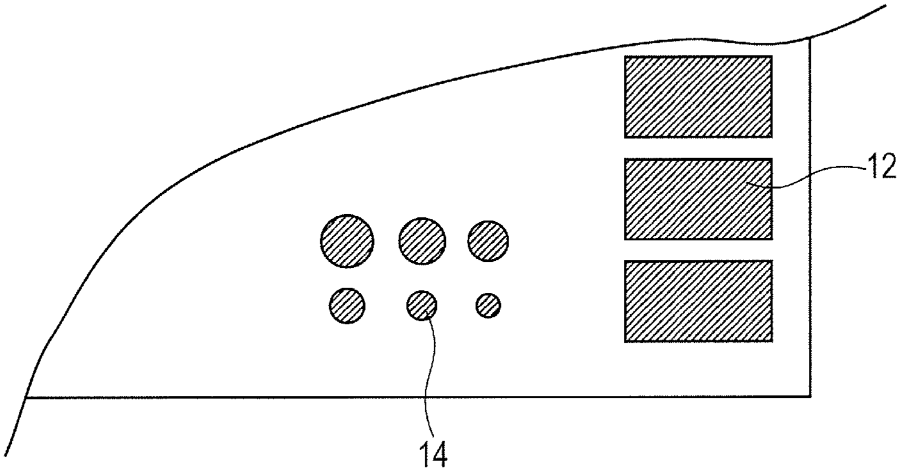
FIG. 5 is a schematic top view after etching of FIG. 4F.
Figure 7:
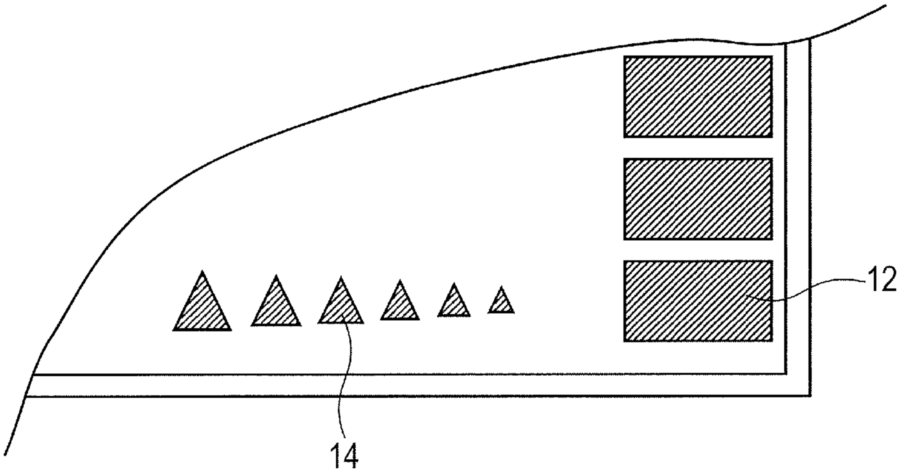
FIG. 7 is a schematic top view illustrating a triangular dummy pattern.
Figure 10:
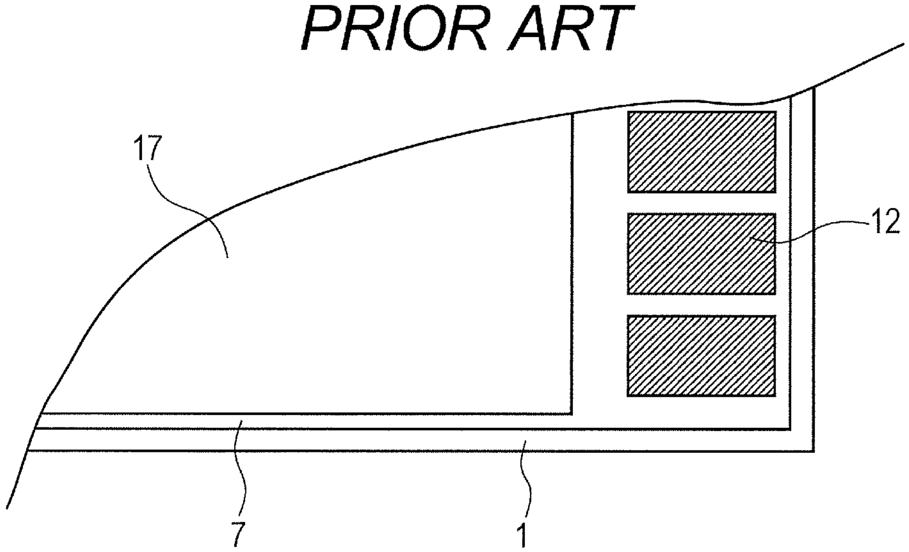
FIG. 10 PRIOR ART
FIG. 10 is an enlarged top view according to the prior art.

In the step of exposing the photoresist, a photomask on which the bump pattern and the detection pattern are drawn may be used to print the photoresist pattern by using an exposure machine of a one-shot exposure system. With regard to the shape of the detection pattern 14, it is preferred to provide multiple fine shapes so that, when physical shock is applied thereto by high pressure washing or the like, both one which is separated and one which is not separated exist. Accordingly, for example, as illustrated in FIG. 5, six circles sized to be ϕ2 to 6 μm seen from above the semiconductor chip are provided, with respect to the related art illustrated in FIG. 10. The sizes may be arbitrarily set, and may be, for example, in a range of about 1 to 10 μm in major axis. Further, the shape of the detection pattern in a section in parallel with the surface of the substrate is not specifically limited, and may be, for example, a circle, an ellipse, a rectangle, a triangle, or a hexagon. FIG. 7 illustrates an exemplary detection pattern of triangles in top view. Further, the detection pattern formation region is not specifically limited. Although, in this embodiment, the detection pattern formation region is placed in the flow path forming member, the detection pattern formation region may be placed anywhere in the semiconductor chip insofar as no problem arises in terms of function and quality.

Figure 4D:
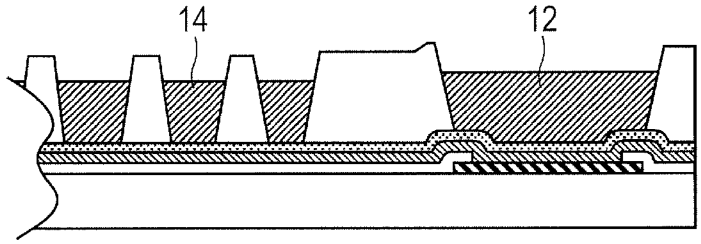

Then, as illustrated in FIG. 4D, the bump 12 and the detection pattern 14 are formed by electroplating.

Specifically, by allowing current to pass through the conductor gold 10 for plating by electroplating, plating deposits in a predetermined region which is not covered with the mask 11 for plating formed of the photoresist, to thereby form the bump 12 and the detection pattern 14. The current application time period can be adjusted so that, for example, the thickness of the plating is 2 μm to 7 μm. For example, the current application time period can be adjusted so that the thickness is 5 μm.

Figure 4E:
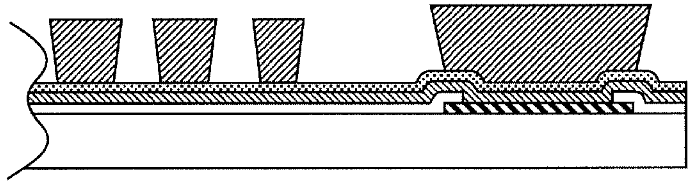

Then, as illustrated in FIG. 4E, the mask 11 for plating is removed.

Specifically, through immersion in a stripping solution for the photoresist for a predetermined time period, the mask 11 for plating is removed to expose the conductor gold 10 for plating.

Figure 4F:
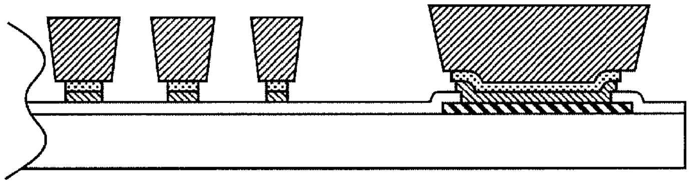

Then, as illustrated in FIG. 4F, the conductor gold 10 for plating and the adhesion improving layer 9 are etched.

Specifically, by immersing the conductor gold 10 for plating in an etchant containing a nitrogen-based organic compound, iodine, and potassium iodide for a predetermined time period, the adhesion improving layer (barrier metal) 9 of a high-melting-point metal material such as TiW is exposed. Further, through immersion in an $H_2O_2$-based etchant for a predetermined time period, the adhesion improving layer (barrier metal) 9 of a high-melting-point metal material such as TiW can be selectively etched with the bump 12 and the detection pattern 14 being the mask.

In the step of etching the plating base film (conductor gold for plating and adhesion improving layer), it is preferred that overetching be performed so that an etching residue is not left. However, degradation of the etchant reduces the etching rate, and thus, the etching time is adjusted to gradually increase during production. In this etching, the plating base film is hidden under the plating, and thus, the plating base cannot be visually observed. Therefore, this etching step may rely only on apparatus conditions in quality assurance. If it can be made sure that the etching is within the predetermined amount of side etching with reliability, the quality can be further improved. Accordingly, the inventors of the present invention invented a process in which the detection pattern according to this embodiment was placed and the amount of side etching was grasped from the state of separation of the detection pattern.

Then, after the etching step, shock is applied to the detection pattern. From the state of separation of the detection pattern, the amount of side etching of the conductor gold for plating and the adhesion improving layer is grasped.

The shock is not specifically limited, and it is enough that some force is applied to the detection pattern. For example, application of force to the detection pattern by water pressure, wind pressure, pressing, and the like is included.

Specifically, after the base film is etched, washing on the semiconductor chip and annealing can be performed. The washing step applies shock to the detection pattern. For example, by performing high pressure washing using SS-80BW (manufactured by DAINIPPON SCREEN MFG. CO., LTD), shock can be applied to the detection pattern.

Figure 6:
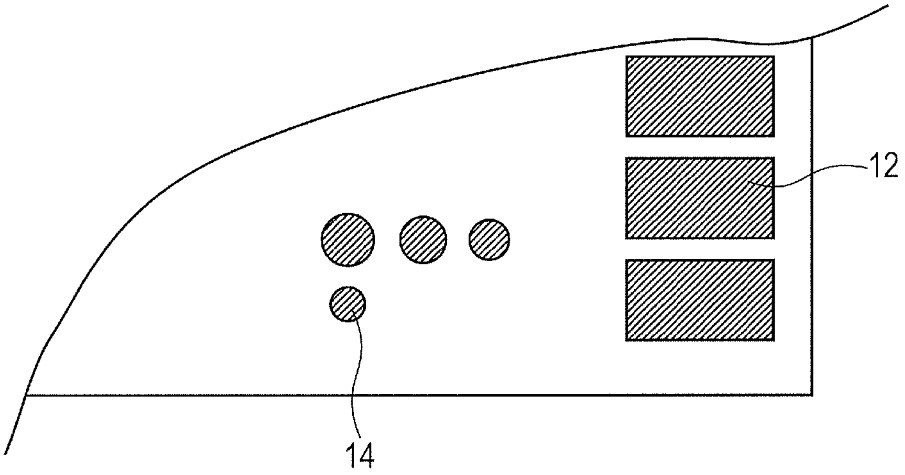
FIG. 6 is a schematic top view after high pressure washing of FIG. 4F.

Table 1 shows the result of high pressure washing using SS-80BW (manufactured by DAINIPPON SCREEN MFG. CO., LTD) after five kinds of circles having different diameters were formed as the detection pattern on the substrate and the above-mentioned etching step was performed. With regard to apparatus condition (1), the pure water pressure was 10 MPa and the washing time period was 40 seconds. This applies physical shock to the entire detection pattern on the silicon substrate 1 by pure water. In the apparatus, when the amount of side etching exceeds the predetermined amount of side etching, the detection pattern can be separated. Specifically, the washing conditions and the shape and the size of the detection pattern are studied in advance, and the detection pattern is formed so that the detection pattern is separated when the amount of side etching exceeds a predetermined value. After the etching is actually performed, shock such as washing is applied to the detection pattern, and, from the state of separation of the detection pattern at that time, the amount of side etching can be grasped. FIG. 6 illustrates a state in which, among circles having different sizes (ϕ2 to 6 μm) as the detection pattern, two circles of the smaller sizes (ϕ2 and ϕ3) in the detection pattern are separated (see Table 1). As shown in Table 1, it is found by visual observation that the circles of ϕ2 and 3 μm in the entire detection pattern are separated by the physical shock. Further, in addition, it was found that, as apparatus condition (2), when the pure water pressure was 10 MPa and the washing time period was 120 seconds, the circle of ϕ4 μm in the detection pattern was also lost. In this way, by studying in advance the conditions of the shock applied to the detection pattern such as the washing conditions and the shape, the size, and the like of the detection pattern, the amount of side etching can be grasped from the state of separation of the detection pattern. Therefore, by forming the detection pattern on the substrate so that the detection pattern separates when the amount of side etching exceeds a predetermined value, the state of the above-mentioned etching step can be grasped with ease by visual observation. Specifically, by forming the detection pattern on the substrate so that the detection pattern separates when the amount of side etching exceeds a predetermined value, an abnormality such as excessive etching in the etching step can be detected with ease. Further, the detection pattern may include one fine shape or multiple fine shapes. By forming multiple fine shapes on the substrate so that the amount of side etching with which the shapes separate differs, the amount of side etching and the state of the etchant can be grasped more accurately. The multiple fine shapes may be geometrically similar to one another in a section taken along a plane in parallel with the surface of the substrate. When the shapes are circles which are geometrically similar to one another, the sizes of the multiple fine shapes may be, for example, in a range of ϕ2 to ϕ7 μm.

TABLE 1

Relationship between size of detection pattern and washing conditions

| | ϕ2 μm | ϕ3 μm | ϕ4 μm | ϕ5 μm | ϕ6 μm |
|---|---|---|---|---|---|
| Washing condition (1) 40 seconds | S | S | L | L | L |
| Washing condition (2) 120 seconds | S | S | S | L | L |

Figure 9:
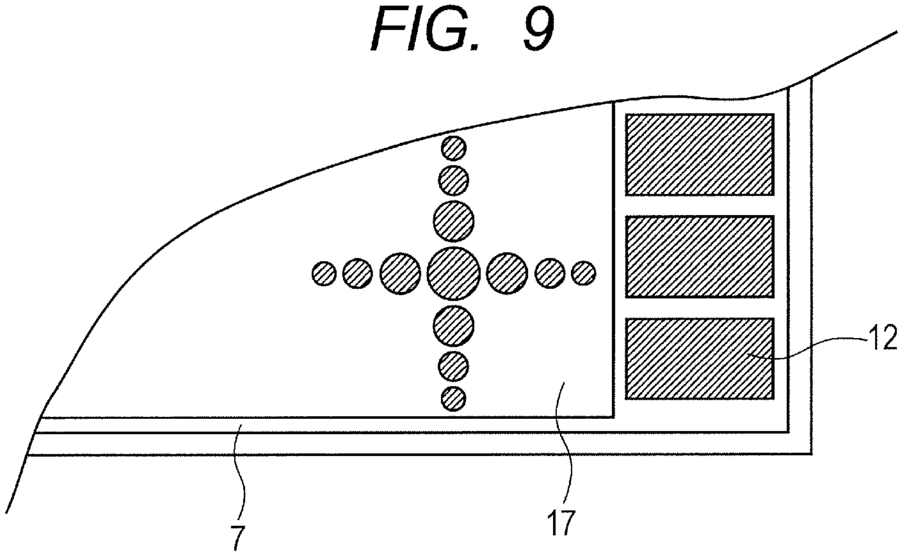
FIG. 9 is an enlarged top view illustrating an exemplary shape of the dummy pattern according to the embodiment of the present invention.

Thickness of bumps and detection pattern: 5 μm
Amount of side etching: 1 μm on one side
Determination criterion: pattern separated = S, pattern left = L Note that, FIG. 9 is an enlarged view illustrating the vicinity of the detection pattern formation region 13 according to this embodiment. As illustrated in FIG. 9, the detection pattern 14 may be formed into the shape of a cross formed of multiple fine shapes which are so sized as to gradually decrease toward the outside. Further, although illustration is omitted, similar detection patterns may be provided in the four corners of the silicon substrate. This enables usage of the detection patterns as alignment marks when the semiconductor chip is mounted. Further, the detection patterns may also be used as alignment marks during electrical connection with TAB.

Figure 4G:
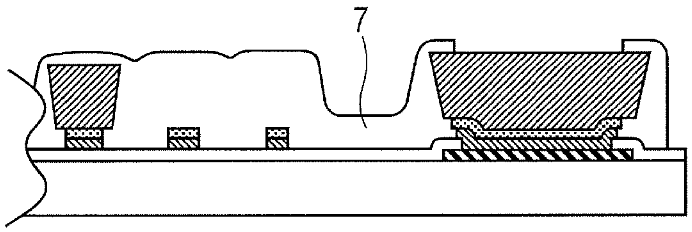

Then, as illustrated in FIG. 4G, a nozzle adhesion improving layer 7 is formed for the purpose of improving adhesion between the silicon substrate 1 and a nozzle layer 17 to be formed later.

The nozzle adhesion improving layer 7 can be formed by, for example, applying a polyether amide resin at an arbitrary thickness by spin coating.

Figure 8:
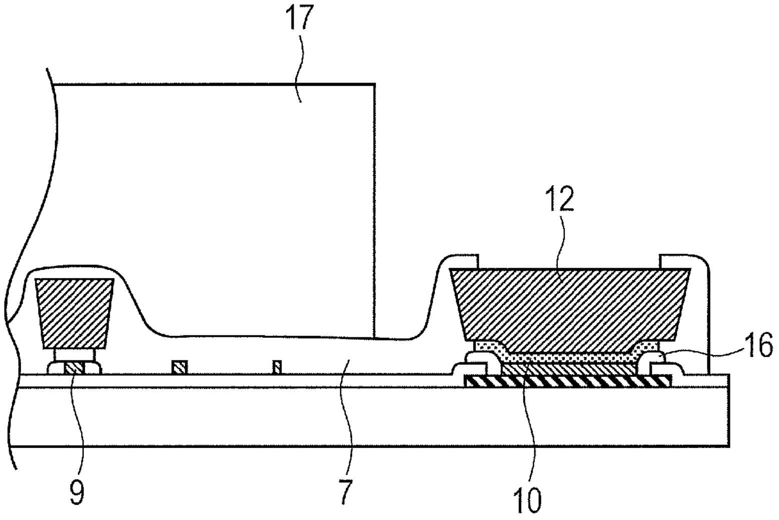
FIG. 8 is a schematic top view for illustrating bubble entrainment.

In this step, when the amount of side etching of the conductor gold 10 for plating and the adhesion improving layer 9 of TiW or the like, which are the base of the bumps, exceeds a predetermined amount, as illustrated in FIG. 8, a bubble 16 may be entrained between an end of a bump and the nozzle adhesion improving layer. Bubble entrainment results in significant loss of long-term electrical reliability. However, during production, it is difficult to determine bubble entrainment by visual observation. Accordingly, by placing the detection pattern according to this embodiment on the substrate, an abnormality in the side etching can be detected with ease.

After that, the nozzle layer 17 is formed on the nozzle adhesion improving layer 7.

Specifically, the bump 12 is formed by patterning the nozzle adhesion improving layer so that the nozzle adhesion improving layer 7 does not cover the entire surface of the bump 12 but part of the bumps 12 is exposed. Then, a covering resin material such as a negative resist is applied onto the nozzle adhesion improving layer 7 at an arbitrary thickness by spin coating, and exposure and development are performed by photolithography, to thereby form the nozzle layer 17 having an ejection orifice 4 for ejecting ink formed therein. On the other hand, the bump 12 as the external electrical connection portion is exposed and are not covered with the nozzle layer 17. The bump 12 is ordinarily encapsulated for the purpose of enhancing the reliability of the contact portion, after being electrically connected to a component such as TAB. In this way, an ink jet recording head which can secure long-term electrical reliability is completed.

It is clear that the above-mentioned embodiment is part of the embodiments of the present invention, and that similar shapes which come in mind with ease also fall within the scope of the present invention.

Further, this embodiment relates to a process for producing a liquid ejection head involving processing multiple wafers to be preferably formed of the silicon substrate 1. Further, this embodiment makes it possible to grasp of the state of the etchant from the state of separation of the detection pattern and to adjust conditions of the etching step in the subsequent production lots. According to this embodiment, by providing the detection pattern and observing the state of separation thereof, the state of the etchant can be grasped with ease. Further, taking the result into consideration, the conditions of the etching in the subsequent production lot can be selected. Therefore, the etching rate in the etching can be controlled efficiently. From an industrial point of view, ordinarily, a batch system in which multiple wafers are processed at the same time is adopted. The detection pattern 14 may be provided on all the wafers which are processed in one batch, or may be provided on some of the wafers, which may be set appropriately in accordance with the number of wafers processed in one batch, the scale of the etching equipment, and the like. Exemplary etching conditions to be fed back include the processing time of the etching, the composition and the concentration of the etchant, and the temperature. The etching conditions to be fed back are not specifically limited, and change of the etchant is also included therein.

Further, the liquid ejection head can be mounted on a fax machine, an apparatus such as a word processor including a printer portion, and further, an industrial recording apparatus combined with a processing apparatus of various kinds. For example, the liquid ejection head can be used for such applications as production of a biochip, printing an electric circuit, and ejection of a chemical solution in a spraying manner.

By using the liquid ejection head, recording can be performed on various kinds of recording media such as paper, thread, fabric, cloth, leather, metal, plastic, glass, wood, and ceramic. Note that, "recording" as used herein means not only giving a meaningful image such as a letter or a shape but also giving a meaningless image such as a pattern to a recording medium.

Further, "liquid" as used herein shall be broadly construed, and means a liquid which is, by being given onto a recording medium, used for formation of an image, a pattern or the like, processing of a recording medium, or treatment of ink or a recording medium. The treatment of ink or a recording medium includes, for example, improvement in fixing property by solidification or insolubilization of a coloring material in ink given to a recording medium, improvement in recording quality or coloring ability, and improvement in image durability.

According to an embodiment of the present invention, it is possible to provide the process for producing a semiconductor chip in which the amount of side etching of the plating base film can be easily grasped through visual observation.

According to an embodiment of the present invention, it is more preferred that a dummy pattern be provided on a semiconductor chip so that the amount of side etching can be detected with ease by visual observation without increasing the cost of production, to thereby enable elimination of initial faulty electrical continuity of the product, enhancement of the structural reliability, and securement of long-term electrical reliability.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-011822, filed Jan. 25, 2013, which is hereby incorporated by reference herein in its entirety.

What is claimed is:

1. A process for producing a semiconductor chip including a substrate and a bump, the process comprising:

(1) forming, on the substrate, a conductor gold for plating to be a base of plating growth;

(2) forming a mask for plating on the conductor gold for plating;

(3) performing plating using the mask for plating to form the bump and multiple dummy patterns having mutually different sizes;

(4) removing the mask for plating;

(5) etching the conductor gold exposed by the removing of the mask for plating, etching a part of the conductor gold between the bump and the substrate, and etching a part of the conductor gold between the dummy patterns and the substrate; and (6) applying a shock to at least the dummy patterns, wherein the method further comprises obtaining an amount of etching of the part of the conductor gold between the bump and the substrate and an amount of etching of the part of the conductor gold between the dummy patterns and the substrate from a number of those dummy patterns of the multiple dummy patterns that are separated from the substrate due to the shock applied in the step (6).

2. The process according to claim 1, wherein, prior to the step (1), a layer of TiW is formed between the conductor gold and the substrate.

3. The process according to claim 1, wherein the step (6) comprises applying the shock to the dummy patterns by water pressure.

4. The process according to claim 1, wherein the semiconductor chip comprises a liquid ejection head for ejecting liquid.

* * * * *